(12) United States Patent
Schmitt et al.

(10) Patent No.: US 12,267,040 B2
(45) Date of Patent: *Apr. 1, 2025

(54) METHOD AND CIRCUIT ARRANGEMENT FOR DETECTING AN ARC, AND PHOTOVOLTAIC (PV) INVERTER HAVING A CORRESPONDING CIRCUIT ARRANGEMENT

(71) Applicant: SMA Solar Technology AG, Niestetal (DE)

(72) Inventors: Rainer Schmitt, Huenfeld (DE); Marcel Kratochvil, Kassel (DE); Sybille Pape, Vellmar (DE)

(73) Assignee: SMA Solar Technology AG, Niestetal (DE)

( * ) Notice: Subject to any disclaimer, the term of this patent is extended or adjusted under 35 U.S.C. 154(b) by 272 days.

This patent is subject to a terminal disclaimer.

(21) Appl. No.: 17/865,573

(22) Filed: Jul. 15, 2022

(65) Prior Publication Data

US 2022/0365145 A1 Nov. 17, 2022

Related U.S. Application Data

(63) Continuation of application No. PCT/EP2021/050831, filed on Jan. 15, 2021.

(30) Foreign Application Priority Data

Jan. 15, 2020 (DE) ...................... 10 2020 100 838.4

(51) Int. Cl.
*H02S 50/00* (2014.01)
*G01R 31/66* (2020.01)
(Continued)

(52) U.S. Cl.
CPC .............. *H02S 50/00* (2013.01); *G01R 31/66* (2020.01); *H02J 3/14* (2013.01); *H02J 3/381* (2013.01);
(Continued)

(58) Field of Classification Search
None
See application file for complete search history.

(56) References Cited

U.S. PATENT DOCUMENTS

| 2012/0134058 A1 | 5/2012 | Pamer et al. |
| 2013/0335861 A1* | 12/2013 | Laschinski ........... H02H 1/0015 361/2 |

(Continued)

FOREIGN PATENT DOCUMENTS

| CN | 103548226 A | 1/2014 |
| CN | 103597363 A | 2/2014 |

(Continued)

OTHER PUBLICATIONS

International Search Report Dated Mar. 29, 2021 for International Application No. PCT/EP2021/050831.

*Primary Examiner* — Nasima Monsur
(74) *Attorney, Agent, or Firm* — Eschweiler & Potashnik, LLC

(57) ABSTRACT

A method for detecting an arc in a circuit including a DC load, a DC source supplying the DC load, and a circuit arrangement between the DC source and the DC load is provided. A power flow between the DC source and an output of the circuit arrangement is cyclically interrupted by a switching circuit, such that the power flow is enabled in an active time window with the first period $\Delta t_1$ and suppressed in an inactive time window with the second period $\Delta t_2$. Detection of a current I and/or a voltage U in two consecutive active time windows and comparison of the detected values of current I and/or voltage U of the active time window with the corresponding detected values from the preceding active time window can signal an arc if these values of the active time window differ from the corresponding values of the preceding active time window by more than a threshold value.

18 Claims, 4 Drawing Sheets

(51) Int. Cl.
*H02J 3/14* (2006.01)
*H02J 3/38* (2006.01)
*H02S 40/32* (2014.01)
*H02S 40/36* (2014.01)

(52) U.S. Cl.
CPC .............. *H02S 40/32* (2014.12); *H02S 40/36* (2014.12); *H02J 2300/24* (2020.01)

(56) References Cited

U.S. PATENT DOCUMENTS

| | | |
|---|---|---|
| 2014/0119072 A1 | 5/2014 | Behrends et al. |
| 2014/0301008 A1* | 10/2014 | Gouy-Pailler ....... H02H 1/0092 361/93.2 |
| 2015/0077884 A1 | 3/2015 | Behrends et al. |
| 2016/0041222 A1 | 2/2016 | Handy |
| 2016/0291073 A1 | 10/2016 | Handy et al. |
| 2017/0170782 A1* | 6/2017 | Yoscovich .............. H02S 50/00 |
| 2018/0097354 A1* | 4/2018 | Yoscovich ................ H02J 3/38 |
| 2022/0360214 A1 | 11/2022 | Kratochvil et al. |

FOREIGN PATENT DOCUMENTS

| | | |
|---|---|---|
| CN | 105675966 A | 6/2016 |
| CN | 114945831 A | 8/2022 |
| DE | 10225259 B3 | 1/2004 |
| KR | 101881411 B1 | 7/2018 |
| WO | 0239561 A2 | 5/2002 |
| WO | 2011017721 A1 | 2/2011 |
| WO | 2012116722 A1 | 9/2012 |
| WO | 2013171329 A1 | 11/2013 |

* cited by examiner

METHOD AND CIRCUIT ARRANGEMENT FOR DETECTING AN ARC, AND PHOTOVOLTAIC (PV) INVERTER HAVING A CORRESPONDING CIRCUIT ARRANGEMENT

CROSS REFERENCE TO RELATED APPLICATIONS

This application is a continuation of International Patent Application Number PCT/EP2021/050831, filed on Jan. 15, 2021, which claims priority to German Patent Application number 10 2020 100 838.4, filed on Jan. 15, 2020, and is hereby incorporated by reference in its entirety.

FIELD

The disclosure relates to a method and a circuit arrangement for detecting an arc, and to a photovoltaic (PV) inverter comprising such a circuit arrangement.

BACKGROUND

Arcs can cause considerable damage in electrical systems, which can lead, for example, to a fire in the electrical system as well as in a building containing the system. Personal injuries are also possible. For this reason, arc detection is an important requirement in electrical systems. This is especially true if the electrical systems have a direct-current (DC) circuit because, in a DC circuit, unlike an alternating-current (AC) circuit, there is not usually a zero crossing of an electrical voltage that can extinguish a burning arc or at least facilitate the quenching of the arc.

A distinction is usually made between two different types of arcs. A series arc occurs when there are contact faults, for example, when cables or plugs come loose but the contacts are so close that there is a locally high electrical field strength in an intermediate space between the contacts. An example of a series arc is also a switching arc that occurs between contacts of a relay during a switching operation. Parallel arcs are more rare and occur, for example, when the positive and negative lines of an electrical system are run close together and the insulation thereof becomes faulty. Here, too, a locally high field strength can exist between the damaged conductors. A power loss converted in a series arc is usually significantly lower than the power loss converted in a parallel arc. Therefore, a series arc between a power source and a load supplied by the power source causes a relatively small change in the transmitted power. In contrast thereto, a parallel arc results in a large change in the electrical power supplied by the power source and ultimately consumed by the load.

A conventional method for detecting an arc uses a noise spectrum that is usually emitted by the arc. When there is an arc in an electrical system, a high-frequency interference voltage or high-frequency interference current is superimposed on a useful electrical voltage or useful electric current. The high-frequency interference voltage and/or the high-frequency interference current can be electrically filtered and detected on the electrical conductors that also carry the useful current or the useful voltage. If a certain interference voltage and/or a certain interference current is exceeded, an arc is signaled. Such a method is described, for example, in WO 2012/116 722 A1. In order to increase the sensitivity of the detection, simultaneous detection of a number of different frequencies within the transmitted noise spectrum is also possible.

Another known method for detecting an arc uses a sudden change in an electrical voltage and/or an electric current that accompanies the formation of the arc. In this case, a current and/or a voltage is usually monitored with a high time resolution for the detection of a sudden change. The method can also be used, where necessary, to check the extent to which an observed change in the current and/or the voltage differs from normal fluctuations in the power consumption of the electrical load. An arc is signaled when the observed change in current and/or voltage differs significantly from the usual consumption fluctuations of the system. Such a method is disclosed, for example, in WO 2011/017721 A1.

Finally, WO 201 3/1 71 329 A1 discloses a method for arc detection that combines the detection of a noise signal with the detection of a sudden change in current. It is possible here to provide the temporal occurrence of the detected noise signal as well as the temporal occurrence of the detected current change in each case with a time stamp. An additional plausibility check for the existence of an arc can be ascertained by comparing both time stamps.

All methods usually use relatively complex and therefore costly measuring systems which become more complex the more reliably a possibly existing arc is detected or the more reliably false signaling of an arc and associated deactivation of the electrical system is to be avoided.

Document DE 102 25 259 B3 discloses an electrical plug connector comprising a main contact that leads during an unplugging process and a lagging auxiliary contact that is connected in parallel therewith. When the connector is unplugged, the main contact is inevitably separated first and the auxiliary contact last from its mating part. In order to avoid an arc associated with an unplugging process, a semiconductor switch connected in series with the auxiliary contact is switched on and off periodically between a contact separation of the main contact and the auxiliary contact.

SUMMARY

The disclosure is directed to a method for detecting an arc, for example, a series arc, in a DC circuit that can be carried out comparatively inexpensively. Complex detection systems are intended to be avoided here as far as possible and instead a relatively simple and inexpensive measuring technique is intended to be used. The disclosure is also directed to a circuit arrangement that is suitable for carrying out the method, as well as a photovoltaic (PV) inverter comprising such a circuit arrangement.

The method according to one embodiment of the disclosure aims to detect an arc in a direct-current (DC) circuit comprising a DC load, a DC source supplying the DC load, and a circuit arrangement arranged between the DC source and the DC load. In this embodiment, the circuit arrangement comprises an input comprising two input terminals for connecting the DC source, an output comprising two output terminals for connecting the DC load, and a switching circuit arranged between the input and the output. The switching circuit has at least two operating modes and can be operated in these modes. Specifically, the switching circuit, optionally in connection with an output voltage $U_{out}$ applied to the output of the circuit arrangement, is configured to enable a power flow P between the DC source and the output of the circuit arrangement in a first operating mode BM1 and configured to suppress the power flow between the DC source and the output of the circuit arrangement in a second operating mode BM2. The method comprises a cyclical interruption of the power flow P between the DC source and the output of the circuit arrangement by means of the switching circuit such that the power flow P is enabled in an active time window with the first period $\Delta t_1$, in which P≠0, and the power flow P is suppressed in an inactive time window with the second period $\Delta t_2$, in which P=0, The method also comprises detecting a current I characterizing the power flow P and/or a voltage U characterizing the power flow P in two consecutive active time windows, comparing the detected values of current I and/or voltage U of an active time window with the corresponding detected values from the preceding active time window, and signaling an arc if the values of current I and/or voltage U of the active time window differ from the corresponding values of the preceding active time window by more than a threshold value.

The arc to be detected may be, for example, a series arc. The circuit arrangement can be wholly or partly part of an electrical device, such as an energy conversion unit, for example an inverter. The DC load can be embodied as a DC load in the conventional sense and for this purpose contain only DC consumers. However, it can also comprise a DC-AC converter that is connected to an AC voltage (AC) load on the output side. The AC load can be an electrical device that is supplied by an AC voltage. As an alternative to this, however, the AC load may also be an energy supply grid into which the DC-AC converter feeds AC power converted from DC power. A cyclical interruption of the power flow P means a repeated interruption of the power flow P that satisfies a rule, which may take place periodically, but does not have to take place periodically. If an interruption occurs periodically, a sum of the first period $\Delta t_1$ and the second period $\Delta t_2$ is constant, that is to say $\Delta t_1 + \Delta t_2 =$ const, while the sum is not constant in the case of an aperiodic interruption. The power flow P can be interrupted periodically if a power fluctuation in the consumption of the DC load can be rated as negligibly small. If this cannot be assumed, the cyclical interruption of the power flow usually takes place aperiodically. The current I to be detected and characterizing the power flow P may be a current flowing between the DC source and the input of the circuit arrangement. As an alternative to this, it may also be a current flowing between the input of the circuit arrangement and the switching circuit or a current flowing between the switching circuit and the output of the circuit arrangement. The detected voltage U may be a voltage applied to the input of the circuit arrangement and/or may be a voltage applied to the output of the circuit arrangement. It is within the scope of the disclosure to detect only one current, but alternatively also to detect a plurality of currents characterizing the power flow P between the DC source and the output. Alternatively or cumulatively to this, it is possible to detect only one voltage, but also to detect a plurality of voltages characterizing the power flow P between the DC source and the output of the circuit arrangement.

The disclosure uses the effect that a power flow P that usually occurs continuously in the DC circuit between the DC source and the DC load is converted by the switching circuit to a power flow P that occurs discontinuously. This applies at least to a first area of the DC circuit that is arranged between the DC source and the output of the circuit arrangement. Here, it is possible, but not absolutely necessary, for the power flow P to be interrupted everywhere in the first area of the DC circuit—that is to say over the entire route between the DC source and the output of the switching arrangement. Instead, it is sufficient if the cyclical interruption of the power flow takes place only on a subsection between the DC source and the output of the circuit arrangement. In specific terms, for example, if the power flow is interrupted only on a subsection between the DC source and the output, charging processes, which are still decaying, of capacities present there can take place in the remaining subsection of the first area of the DC circuit. However, by suppressing the power flow on a subsection of the first area of the DC circuit, the power flow on the remaining subsection within the first area of the DC circuit is at least substantially reduced in response. In a second area of the DC circuit that is arranged between the output of the circuit arrangement and the DC load, the power flow can be either discontinuous or continuous.

Since there is no power flow from the DC source to the output of the circuit arrangement in the deactivated second time windows, a zero crossing of a current I is purposefully brought about in the DC circuit, but at least in the first area of the DC circuit, and there at least on a subsection of the first area of the DC circuit extending from the DC source to the output of the switching arrangement. In summary, it applies to the entire first area of the DC circuit between the DC source and the output of the circuit arrangement that the power flow P, if it is not completely interrupted everywhere, is at least largely reduced everywhere. At the same time, the energy is drawn from a series arc that may be present in the first area of the DC circuit. Due to the energy draw, the arc cannot continue to burn, but instead is quenched, at least temporarily within the inactive time window. If, in an active time window following the inactive time window, a power flow P again takes place from the DC source to the output of the circuit arrangement, the risk that this power flow P likewise accompanied by a burning arc, relative to the previous active time window in which the arc was still burning, is then significantly reduced. In other words: if an arc burned in the chronologically preceding one of the two active time windows, the arc is no longer present in the chronologically following one of the two active time windows with a high degree of probability. In this case, the probability increases as the second period of the inactive time window or the inactive time windows that lie between the two active time windows increases.

According to the disclosure, a respective current I and/or a voltage U are detected in each of the two time-offset active time windows, which are assigned to the power flow P in the respective active time window. Since a power loss consumed by an arc can also be assigned to the arc, the electrical variables of current I and/or voltage U change depending on the existence of the arc in the DC circuit. A comparison of the detected values of current I and/or voltage U of the two time-offset active time windows can therefore be used to determine whether or not one of the two active time windows has an arc in contrast to the other of the two active time windows. This applies, in particular, if the consumption of the DC load over time is known for other reasons and/or does not change over time, at least not significantly. Specifically, an arc can therefore be signaled when the values of current I and/or voltage U of the chronologically following active time window differ from the corresponding values of current I and/or voltage of the following active time window by more than a predefined threshold value.

In the method according to the disclosure, no special requirements are to be made of a measuring device (e.g., a sensor or circuitry) for detecting the electrical variables from current I and/or voltage U. The measuring device does not have to have high accuracy or high temporal resolution, that is to say a high measuring frequency, either. This is because it is not important to detect a sudden change in the electrical variables. Instead, it is sufficient to detect only one value of the electrical variables that is representative of the respective active time window, for example, a mean value of the respective active time window. For this reason, the measuring device for detecting the electrical variables can be designed very cost-effectively. It is often already present in the DC circuit, which is why no additional costs are incurred in this case. Since, according to the disclosure, the power flow P in the DC circuit between the DC source and the output of the circuit arrangement occurs discontinuously, quasi in individual energy packets, even during normal operation of the DC load, a complex detection unit for triggering an otherwise one-time interruption of a continuously occurring power flow is not required. Instead, the method according to the disclosure operates as if there were an arc, for example, a series arc, in each of the active time windows, at least in the first area of the DC circuit, which would have to be quenched by the interruption, caused by means of the switching circuit, of the power flow P coming from the DC source in the inactive time window. The information as to whether an arc was actually present in the preceding active time window only results from the detection of the electrical variables of the current I and/or voltage U in the chronologically following active time window and the comparison of these with the corresponding detected variables of the current I and/or voltage U of the chronologically preceding active time window.

In the inactive time windows, the DC load can be supplied from an intermediate energy store that is already present at an input of the DC load, for example, a capacitance, or from a capacitance that is additionally to be provided and connected in parallel with the output of the circuit arrangement. In addition, the second periods $\Delta t_2$ of the inactive time windows can be selected to be so small that the capacitance discharges only insignificantly, such that an undersupply of the DC load and any potentially associated faulty operation of the DC load can be largely avoided.

In one embodiment of the method, the switching circuit, optionally in connection with an output voltage $U_{out}$ applied to the output of the circuit arrangement, can interrupt the power flow P between the DC source and the output of the circuit arrangement in response to a signaled arc permanently, but at least for a period that is long compared to the second period $\Delta t_2$ of the inactive time window. For example, such an interruption occurring in response to a signaled arc can last for several minutes or until it is manually acknowledged. In this way, a specialist can be given the opportunity to identify and repair any damage in the DC circuit caused by the detected arc.

The active time window and the preceding active time window, whose values of the current I and/or voltage U are compared with one another, do not necessarily have to follow one another directly. Instead, they can be separated from one another by a number of inactive time windows and at least one further active time window. In one embodiment of the method, however, the active time window and the preceding active time window can also be separated from one another by exactly one inactive time window. In this way, a change in the consumption of the DC load that occurs in the meantime is less important when comparing the electrical variables.

In one embodiment of the method, a value of the second period $\Delta t_2$ of the inactive time window can be selected so that it is not only sufficiently high to quench an arc that may be present in the DC circuit, but instead is also sufficiently high to suppress reignition of the previously quenched arc in an active time window that chronologically follows the inactive time window. The value of the second period can depend in particular on a thermal time constant associated with the arc and in this case can in particular be greater than the corresponding thermal time constant. The thermal time constant describes a decrease over time in the electrical conductivity of the plasma arc column in the event that no more electrical energy is delivered to the arc, for example, because the power flow in the first area of the DC circuit was interrupted by means of the switching circuit. Specifically, if, after an arc has been quenched, a time for the renewed application of an electrical voltage U to the arc column is greater than the thermal time constant, the arc cannot be reignited. In addition, a value of the minimum necessary interruption time of the current flow can also depend on the power converted in the burning arc. Therefore, a value of the second period $\Delta t_2$ of the inactive time window can also be selected depending on the detected values of current I and/or voltage U of the immediately preceding active time window. In particular, the value of the second period $\Delta t_2$ can increase as the value of the detected current I and/or the detected voltage U from the preceding time window increases. Tests have shown that it is sufficient if the second period $\Delta t_2$ comprises a value between 0.1 ms and 10.0 ms, for example, a value between 0.3 ms and 4.0 ms.

In one embodiment of the method, the power flow P is interrupted between the input and the output of the circuit arrangement by means of the switching circuit. The circuit arrangement can have an input capacitance that is connected in parallel with its input. In this case, an input current $I_{in}$ flowing at the input and/or an input voltage $U_{in}$ applied to the input between the input terminals can advantageously additionally be detected in the inactive time window. The second period $\Delta t_2$ of the inactive time window can now be determined depending on the detected input current $I_{in}$ and/or on the detected input voltage $U_{in}$. Specifically, the second period $\Delta t_2$ of the inactive time window can, for example, be limited in that the input current $I_{in}$ detected in the inactive time window falls below a further current threshold value $I_{TH2}$, from which there is no significant further charging of the input capacitance. This can be established, for example, at the temporal profile of the input voltage $U_{in}$ applied to the input capacitance—and thus also to the input of the circuit arrangement. In addition, the further current threshold value $I_{TH2}$ is selected, for example, selected to be so low, that a series arc, if it should be present between the DC source and the input of the circuit arrangement, cannot continue to burn. This can be empirically determined or verified, for example. Thus, with the current falling below the further current threshold value $I_{TH2}$, it is ensured that any series arc that may exist between the DC source and the input of the circuit arrangement is safely quenched.

It goes without saying that the input current $I_{in}$ flowing at the input of the circuit arrangement can be detected by means of a corresponding current sensor. However, this requires the reservation of an additional current sensor in addition to a voltage sensor that is often present there anyway. In one embodiment of the method in which the circuit arrangement has an input capacitance connected in parallel with its input, and in which the power flow P between the input and the output is interrupted, the current flowing between the DC source and the input of the circuit arrangement can at least partly, but also for the most part or completely be formed by the input current $I_{in}$ flowing at the input. In this case, in the inactive time window, the input current $I_{in}$ flowing at the input, in particular the input current $I_{in}$ flowing into the input capacitance, can now also be measured by means of a change over time in the input voltage $U_{in}$ applied to the input capacitance. Specifically, the time derivative of the input voltage $U_{in}$ applied across the input capacitance, which voltage is also applied between the input terminals, provides here a measure of the current flowing between the DC source and the input of the circuit arrangement. In this way, it is possible with just one voltage sensor to determine both the input voltage $U_{in}$ applied to the input between the input terminals as well as the input current $I_{in}$ flowing at the input.

In a further embodiment of the method, the switching circuit of the circuit arrangement is formed by a DC-DC converter, for example, a step-up converter. In addition, the circuit arrangement has an output capacitance connected in parallel with the output thereof. In one embodiment, in the active time window, a voltage $U_{out}$ applied to the output capacitance can be increased toward an end of the first period $\Delta t_1$ by the switching circuit. For example, when at least 50%, for example, at least 75%, or at least 90%, of the first period $\Delta t_1$ of the active time window is reached or exceeded, the voltage $U_{out}$ applied to the output capacitance can be increased. In doing so, the increase can be performed by at least 10%, for example, by at least 20%, of a voltage $U_{out}$ applied to the output capacitance at the beginning of the active time window. In any case, with a DC-DC converter comprising a freewheeling diode and designed as a step-up converter, the voltage $U_{out}$ applied to the output capacitance should at least equal or exceed the open circuit voltage of the DC source. This is one way to ensure that the switching circuit in connection with the voltage $U_{out}$ applied on the output side suppresses the power flow between the input and the output of the circuit arrangement. In addition, in this way, energy that is intermediately stored in the output capacitance and from which the DC load is also supplied, for example, in the immediately adjacent inactive time window can be increased. An upper limit for the second period $\Delta t_2$ for the immediately adjacent inactive time window can be increased and a risk of an incorrect supply of the DC load, for example, during the inactive time window, can be avoided, or at least reduced. In contrast, the losses of the DC-DC converter that occur for intermediate storage of the energy occur at the end of the active time window, that is to say during a fraction of the first period $\Delta t_1$, and not throughout the entire first time window. In addition, the components providing the output capacitance are loaded with high voltage values for a fraction of the first period.

In one embodiment of the method, a value of the first period $\Delta t_1$ of the active time window can be selected so that an arc energy that would be generated by a power loss of an assumed arc in the active time window does not exceed a predetermined maximum permitted energy value $E_{max}$. In this case, it is assumed that there is a fictitious arc in the currently active time window, but this arc does not necessarily exist in reality. However, based on the assumption of the fictitious arc burning in the active time window, the current I in the active time window and an assumed voltage drop $\Delta u_{LB}$ of the arc can be used to estimate the first period $\Delta t_1$ of the active time window according to $$\Delta t_1 = \frac{E_{max}}{\Delta U_{LB} * I}$$

Depending on the temporal resolution capability of the present measuring device, several detected values for the current I can also be used. In this case, in the denominator of the above equation for the current I, an average current $I_{average}$ can be used. For the voltage drop $\Delta u_{LB}$ of the arc, there are experimentally determined or experience-based values. For example, in conventional PV systems, a value between 30 V and 40 V can be used as a good approximation for the voltage drop of the arc.

With regards to detecting an arc in a DC circuit of a photovoltaic (PV) system, it is advantageous in one embodiment if the maximum possible energy value $E_{max}$ has a value of $E_{max}$=200 J, which is also listed in relevant standards. Specifically, if the amount of energy transported in the active time window does not exceed the value 200 J, in the event that an arc was actually detected in the preceding active time window, the PV system can be restarted in a simplified form and in particular without using an electrical specialist.

In one embodiment of the method, a plurality of DC sources can be connected to the DC load in parallel with one another via a circuit arrangement in each case in order to jointly supply the DC load with their respective power flows P. In doing so, the method for detecting an arc, for example, a series arc, can be carried out simultaneously for each of the DC sources, with the inactive time windows assigned to the respective cyclical interruption of the power flows P being arranged so as to be, in one embodiment, offset in time from one another when the method is carried out for the different DC sources and do not overlap if possible. The cyclical interruption of the power flows P is advantageously carried out, in one embodiment, in such a way that at least a time overlap between the inactive time windows of the different DC sources is minimized. In this way, robust operation of the DC load is ensured by minimizing a fluctuation in the total power flow, which results from a sum of the individual power flows P from the multiple DC sources.

A circuit arrangement according to the disclosure for detecting an arc in a DC circuit comprises an input comprising two input terminals for connecting a DC source and an output comprising two output terminals for connecting a DC load, and a switching circuit arranged between the input and the output, wherein the switching circuit, optionally in connection with an output voltage $U_{out}$ applied to the output of the circuit arrangement, is designed and set up to enable a power flow P between the input and the output in a first operating mode BM1 and to suppress a power flow P between the input and the output in a second operating mode BM2. The circuit arrangement further comprises a measuring device for determining a voltage U applied to the input or to the output and/or a current I flowing in a connection line from one of the input terminals to one of the output terminals, and a control circuit for controlling the switching circuit and optionally the measuring device.

In one embodiment of the circuit arrangement, the control circuit is configured and set up in conjunction with the switching circuit and the measuring device to carry out the method according to the disclosure.

In order for the switching circuit to suppress the power flow P between the input and the output, it can have one or more controllable switches, for example, semiconductor switches. Alternatively or cumulatively, it is also possible for the switching circuit to have one or more non-controllable semiconductor switches, for example diodes, to suppress the power flow P. The control circuit can comprise a separate control circuit, in one embodiment. Alternatively, however, the control circuit can also be designed as a component of a control circuit that is already present in the DC circuit. This results in the advantages already explained in connection with the method.

In one embodiment of the circuit arrangement, the switching circuit can have a semiconductor switch arranged in one of the connection lines from one of the input terminals to one of the output terminals. The semiconductor switch can be free of an intrinsically formed freewheeling diode or a separately formed freewheeling diode connected in parallel with current-carrying terminals of the semiconductor switch. As an alternative to this, however, the semiconductor switch can also have a freewheeling diode connected in parallel with current-carrying terminals of the semiconductor switch. In this case, the freewheeling diode can be designed either as an intrinsic freewheeling diode or as a separately formed freewheeling diode. If the semiconductor switch has a freewheeling diode, it can be arranged, for example, in such a way that it is reverse-biased with respect to a normal current direction of the DC circuit.

The circuit arrangement may, in one embodiment, comprise an intermediate energy store connected in parallel with the output, for example, a capacitance. Using the capacitance, the circuit arrangement is able to intermediately store a limited amount of energy from the DC source in the active time window, by means of which energy the DC load is supplied in the following inactive time window. In this way, it is possible to supply the DC load during the inactive time window even if the DC load does not include the possibility of intermediate storage. In this case, the power flow P is discontinuous only in the first area of the DC circuit, while it is continuous in the second area of the DC circuit. According to one embodiment, the circuit arrangement according to the disclosure or the switching circuit of the circuit arrangement can be designed as a DC-DC converter, for example, as a step-up converter. In this case, the power flow P from the DC source to the output of the circuit arrangement can be interrupted in that the circuit arrangement, for example, the switching circuit of the circuit arrangement, is deactivated and a voltage applied to the output of the circuit arrangement is greater than a voltage applied to the input of the circuit arrangement. Experiments show that deactivation over a few, advantageously a maximum of 8, switching cycles of the DC-DC converter is sufficient.

A photovoltaic (PV) inverter according to one embodiment of the disclosure comprises at least one input comprising two input terminals for connecting a PV string as a DC source and an output for connecting an AC voltage (AC) grid, a DC-AC converter for converting a DC voltage to an AC voltage, and a circuit arrangement according to the disclosure. In this case, the input of the circuit arrangement is connected to the at least one input of the PV inverter and the output of the circuit arrangement is connected to an input of the DC-AC converter. The inverter may be a single-phase PV inverter, which has a maximum of one phase conductor terminal and one neutral conductor terminal on the output side. Alternatively, it may also be a multiphase PV inverter comprising a plurality of phase terminals on the output side, in particular three phase terminals on the output side, and one neutral conductor terminal on the output side. The control circuit of the circuit arrangement can be integrated in a control circuit of the PV inverter, or in a superordinate control circuit of a PV system comprising the PV inverter. The advantages already mentioned in connection with the method and the circuit arrangement result.

If the method according to the disclosure for detecting an arc, for example, a series arc, is applied within a PV system, in which the DC source comprises by a PV string and the DC load comprises a single-phase DC-AC converter connected on the output side to an AC voltage (AC) grid, it is advantageous in one embodiment if the cyclical interruption of the power flow P takes place in such a way that there is a zero crossing of an AC current $I_{AC}(t)$ flowing via an output of the DC-AC converter during the second period $\Delta t_2$ of the inactive time window. In the case of a single-phase DC-AC converter, power is namely drawn from an intermediate store of the PV inverter, for example, a link circuit capacitance of a DC link circuit, in a sinusoidally pulsed manner at a frequency that corresponds to twice the frequency of the AC grid connected to the PV inverter, wherein, in the vicinity of the zero crossings of the AC current $I_{AC}(t)$ generated by the DC-AC converter, the lowest power or energy is drawn from the intermediate store. If the inactive time windows now temporally overlap with the zero crossings of the AC current $I_{AC}(t)$, a voltage ripple of the DC link circuit can be minimized.

In one embodiment of the disclosure, the PV inverter can have just one input to which a PV string is connected as a DC source. In a further embodiment of the disclosure, however, the PV inverter can also have a plurality of inputs that are each designed for connecting a respective PV string as a DC source. In this case, the inputs can each be connected in parallel with one another via a DC-DC converter to a common DC link circuit. The DC link circuit, which can include a link circuit capacitance, can in turn be connected to an input of the DC-AC converter. In this case, each of the inputs of the PV inverter can be assigned a circuit arrangement according to the disclosure, each of the inputs of the PV inverter being connected to the input of a circuit arrangement assigned thereto and the output of each of the circuit arrangements being connected to the input of the DC-AC converter each. It is within the scope of the disclosure if each of the circuit arrangements is formed at least partially, possibly also completely, by one of the DC-DC converters, respectively.

In one embodiment of the PV inverter, the control circuits of the circuit arrangements can be included in a superordinate control circuit of the PV inverter. In this case, at the same time, the superordinate control circuit is set up to control the DC-AC converter and the DC-DC converter of the PV inverter in such a way that, during operation of the PV inverter, a voltage applied to the DC link circuit is above a maximum value of the open circuit voltages of the individual PV strings.

BRIEF DESCRIPTION OF THE FIGURES

In the following, the disclosure is illustrated using figures. In the figures

DETAILED DESCRIPTION

Figure 1:
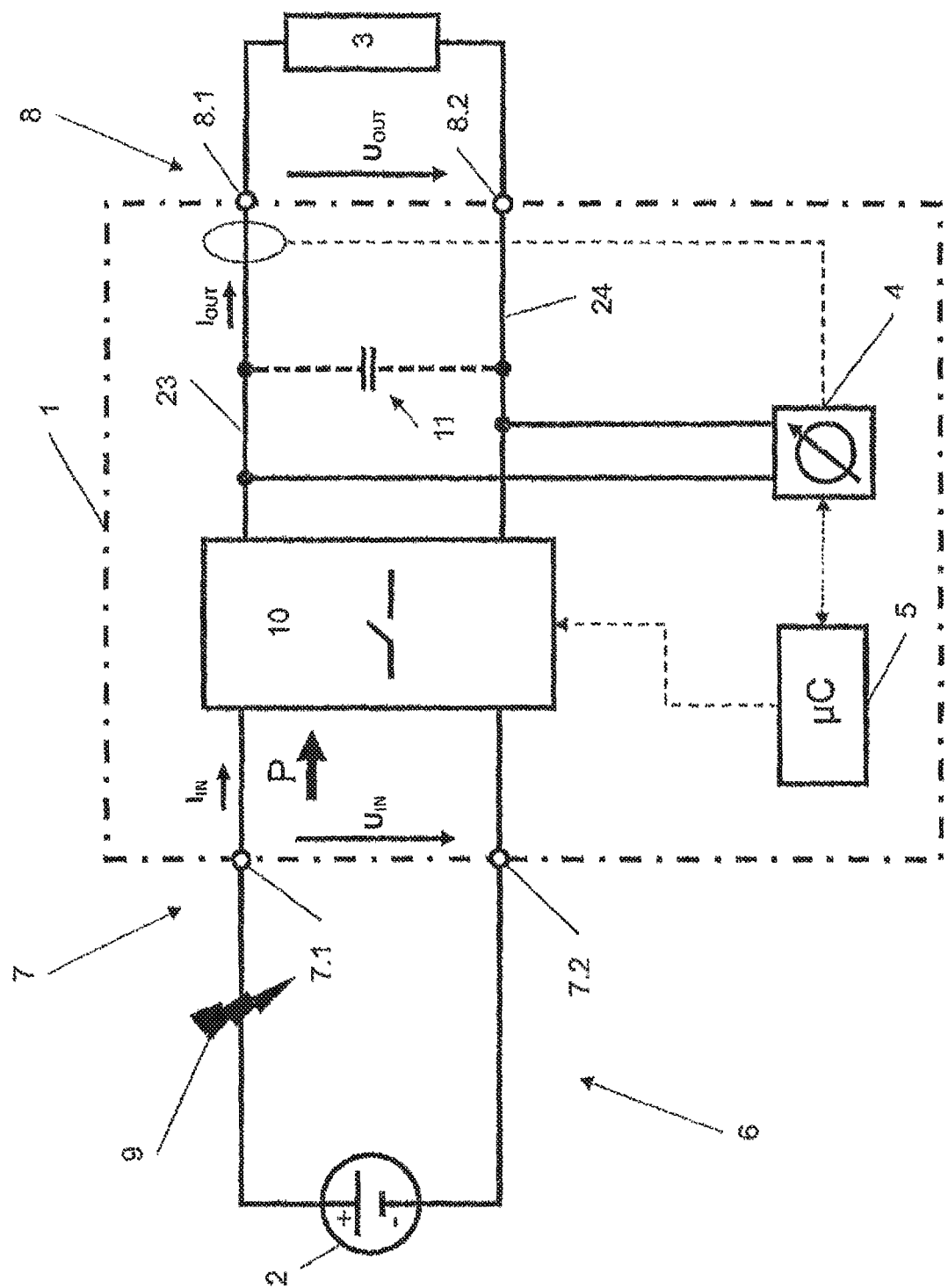
FIG. 1 shows a DC circuit comprising a DC source, a DC load, and a circuit arrangement according to a first embodiment of the disclosure.

FIG. 1 shows a direct-current (DC) circuit 6 comprising a DC source 2, a DC load 3 and a circuit arrangement 1 according to a first embodiment of the disclosure. The DC source 2 may have an internal resistance (not explicitly shown in FIG. 1). The circuit arrangement 1 has an input 7 comprising a first input terminal 7.1 and a second input terminal 7.2, to which input the DC source 2 is connected. The circuit arrangement 1 also has an output 8 comprising a first output terminal 8.1 and a second output terminal, the output being connected to the DC load 3. Each of the input terminals 7.1, 7.2 is connected via a respective connection line 23, 24 to a corresponding one of the output terminals 8.1, 8.2. A switching circuit 10 is arranged between the input 7 and the output 8. The switching circuit 10, optionally in connection with a voltage $U_{out}$ applied to the output 8 of the circuit arrangement 1, is configured to enable a power flow P between the DC source 2 and the output 8 during a first operating mode BM1 and to suppress it during a second operating mode BM2. For example, a power flow P between the input 7 and the output 8 can be made possible by means of the switching circuit 10 during the first operating mode BM1 and prevented during the second operating mode BM2. For this purpose, the switching circuit 10 has at least one controllable switch, possibly also a plurality of controllable switches. The switches may be electromechanical switches, or semiconductor switches. In addition, the switching circuit 10 can also have one or more non-controllable semiconductor switches, for example, diodes. The switching circuit 10 is controlled by a control circuit 5. The circuit arrangement 1 also comprises a measuring device 4 that is configured to measure an output voltage $U_{out}$ applied to the output 8 of the circuit arrangement 1 and/or an output current $I_{out}$ flowing via the output 8. Alternatively or cumulatively, the measuring device 4 can also be configured to measure an input voltage $U_{in}$ applied to the input 7 and/or an input current $I_{in}$ flowing via the input 7. The measuring device 4 is connected to the control circuit 5 for the purpose of communication and control. The circuit arrangement 1 can optionally comprise an output capacitance 11—illustrated by dashed lines in FIG. 1—that is connected in parallel with its output 8. Alternatively or cumulatively, the circuit arrangement 1 can comprise an input capacitance that is connected in parallel with its input 7 (not shown in FIG. 1).

During operation of the circuit arrangement 1, a power flow P between the DC source 2 and the output 8 of the circuit arrangement 1 is now interrupted cyclically by means of the switching circuit 10—and optionally in connection with an output voltage $U_{out}$ applied to the output 8 of the circuit arrangement 1, that is to say in a manner satisfying a rule and repeatedly. A power flow P between the DC source 2 and the output 8 therefore takes place discontinuously, with—as will be explained in connection with FIG. 3—active time windows 31 with a first period $\Delta t_1$ alternating with inactive time windows 32 with a second period $\Delta t_2$. During the active time window 31, a power flow P different from 0 thus takes place between the DC source 2 and the output 8, with the power flow P taking the value of 0 in the inactive time windows 32.

During two consecutive active time windows 31, a current I and/or a voltage U are now respectively determined by means of the measuring device 4 and communicated to the control circuit 5. The current I may be the input current $I_{in}$ or the output current $I_{out}$ and the voltage may be the input voltage $U_{in}$ or the output voltage $U_{out}$, respectively. By means of the control circuit 5, the values of the current I and/or of the voltage U of the consecutive active time windows 31 are compared with one another. The control circuit 5 is set up to signal an arc 9, for example, a series arc, if the values of current I and/or voltage U of the chronologically following active time window 31 deviate by more than a threshold value from the corresponding values of current I and/or voltage U of the preceding active time window 31.

Figure 2:
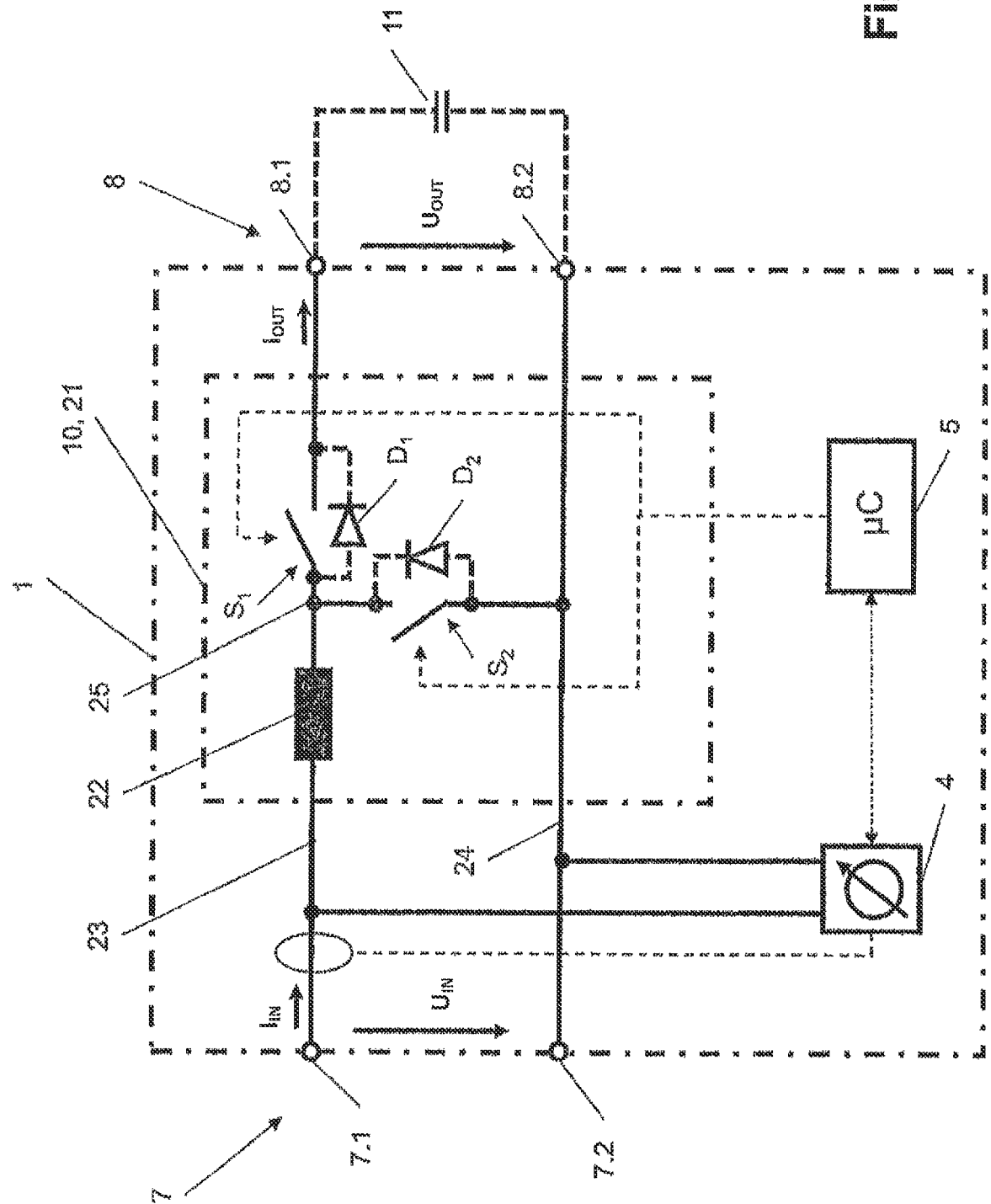
FIG. 2 shows a circuit arrangement according to a second embodiment of the disclosure.

FIG. 2 shows a circuit arrangement 1 according to a second embodiment of the disclosure. It is similar in some components to the first embodiment already described in FIG. 1, which is why reference is made to the descriptions under FIG. 1 for the matching features. Primarily the differences between the second embodiment and the first embodiment are explained below.

According to the second embodiment, the circuit arrangement 1 is configured as a DC-DC converter 21, in particular, as a step-up converter, to convert an input voltage $U_{in}$ applied to the input 7 to an output voltage $U_{out}$ applied to the output 8. For this purpose, the switching circuit 10 of the circuit arrangement 1 comprises an inductance 22 and a first semiconductor switch $S_1$ connected in series therewith within the first connection line 23 between the first input terminal 7.1 and the first output terminal 8.1. A second semiconductor switch $S_2$ is connected by way of its first terminal to a connection point 25 of the inductance 22 and the first semiconductor switch $S_1$ and connected by way of its second terminal to the second connection line 24. The first $S_1$ and the second semiconductor switch $S_2$ may each comprise an intrinsic or separately formed freewheeling diode $D_1$, $D_2$, illustrated using dashes in FIG. 2.

Figure 3:
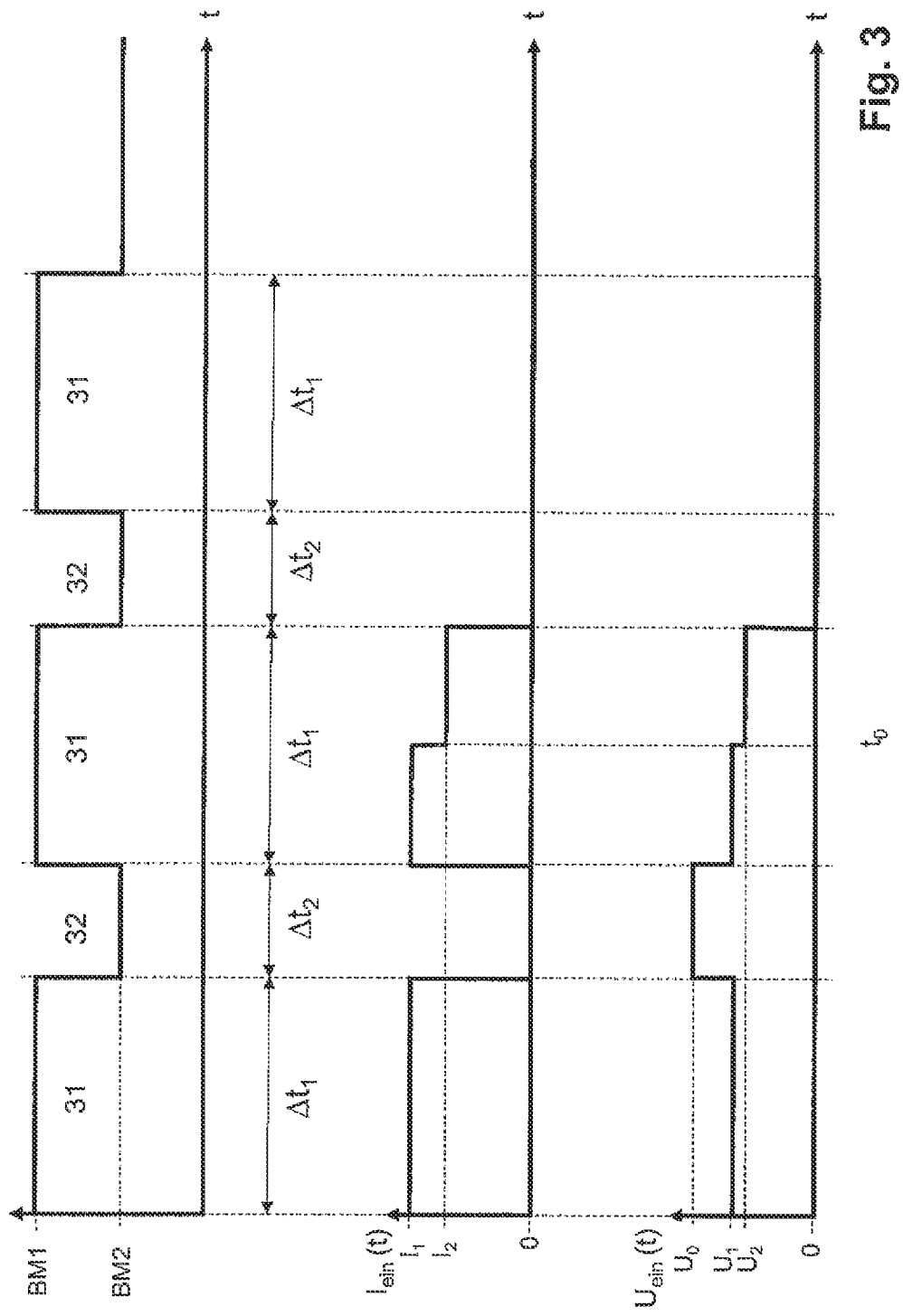
FIG. 3 shows time profiles for the operating mode, current and voltage of the circuit arrangement from FIG. 2 during the method according to the disclosure.

During the first operating mode BM1, in other words in the active time window 31 shown in FIG. 3 with the first period $\Delta t_1$, the circuit arrangement 1 operates as a step-up converter and converts the input voltage $U_{in}$ to a larger output voltage $U_{out}$ relative to the input voltage $U_{in}$ by means of suitable clocking of the first $S_1$ and optionally the second semiconductor switch $S_2$. In this case, the output voltage $U_{out}$ is advantageously selected in such a way that it is greater than an open circuit voltage $U_0$ of a DC source 2 (not shown in FIG. 2) connected to the input 7. An energy associated with the output voltage $U_{out}$ is temporarily stored in an output capacitance 11 arranged in parallel with the output 8. In the second operating mode BM2, that is to say in the inactive time window 32 with the second period $\Delta t_2$, illustrated in FIG. 3, the clocking of the semiconductor switches $S_1$, $S_2$ is interrupted by the control circuit 5. The semiconductor switches $S_1$, $S_2$ are permanently open during the second operating mode BM2. The second period $\Delta t_2$ can last for a few clock cycles of the DC-DC converter 21. Since the voltage $U_{out}$ applied to the output 8 is now selected in such a way that it is greater than the open circuit voltage $U_0$ of the DC source 2 connected to the input, the freewheeling diode $D_1$, which may be present and associated with the first semiconductor switch $S_1$, blocks a current flow between the first input terminal 7.1 and the first output terminal 8.1, and thus a power flow P between the DC source 2 and the output 8 of the circuit arrangement 1.

By means of the control circuit 5, the circuit arrangement 1 is set in an alternating manner during the first period $\Delta t_1$ to the first operating mode BM1 and during the second period $\Delta t_2$ to the second operating mode BM1, which generates a discontinuous power flow P from the DC source 2 to the output 8 of the circuit arrangement 1. Detection and evaluation of the values of current I and/or voltage U in two chronologically consecutive active time windows 31, and selective signaling of an arc based on the comparison takes place by means of the control circuit 5 as already described in connection with FIG. 1.

FIG. 3 shows, below one another, time profiles for operating modes BM1, BM2 of the switching circuit 10 of the circuit arrangement 1 (upper graph), as well as current I(t) (middle graph) and voltage U(t) (lower graph) of the circuit arrangement 1 from FIG. 2 during the method according to the disclosure. The time profiles of current and voltage each involve, for example, variables $I_{in}(t)$, $U_{in}(t)$ detected by using the measuring device 4 (e.g., a device, sensor or circuitry) at the input 7 of the circuit arrangement 1. In this case, the time profiles reflect the behavior of the circuit arrangement 1 in close temporal proximity to a series arc 9 that ignites at the time $t_0$.

As illustrated in the upper graph, active time windows 31 of the period $\Delta t_1$ in which the circuit arrangement 1 is in the first operating mode BM1, alternate with inactive time windows 32 of the period $\Delta t_2$ in which the circuit arrangement is in the second operating mode BM2. In the first active time window 31, the current $I_{in}(t)$ takes the value $I_1$ and the voltage $U_{in}(t)$ takes the value $U_1$. The values of the current $I_1$ and the voltage $U_1$ result from the power consumption of the DC load 3 connected to the output 8 of the circuit arrangement 1. In the immediately adjacent inactive time window 32, the power flow P between the DC source 2 and the output 8 of the circuit arrangement 1 is interrupted for the second period $\Delta t_2$. The current $I_{in}(t)$ flowing via the input 7 takes a value of 0 A, while the voltage $U_{in}(t)$ applied to the input 7 corresponds to the open circuit voltage $U_0$ of the DC source 2. The open circuit voltage $U_0$ is usually higher than the voltage $U_1$ of the loaded DC source 2 due to an always present internal resistance of a real DC source 2, for example PV generator. In the next active time window 31, in this case the second active time window 31, the current $I_{in}(t)$ first corresponds to the value of the preceding active time window 31 up to the time $t_0$ at which the arc 9 in the DC circuit 6, in particular between the DC source 2 and the input of the circuit arrangement 1, ignites. From the time $t_0$, there is a sudden slight drop in the current values, and possibly also the voltage, from the original values $I_1$, $U_1$ to the values $I_2$, $U_2$. The sudden drop in current is based on a power loss and an associated voltage drop of a series arc 9 starting from $t_0$. For example, the series arc 9 burns across a microgap in a broken conductor. In the adjoining inactive time window 32, the series arc 9 is quenched by the power flow P between the DC source 2 and the output 8 of the circuit arrangement 1 being interrupted again. The current $I_{in}(t)$ flowing via the input 7 again takes the value 0 A. The voltage $U_{in}(t)$ applied to the input 7 in the second inactive time window 32 is now no longer defined via the DC source 2, owing to the microgap present upstream of the input, but rather via the voltage $U_{out}(t)$ applied to the output 8 and an impedance ratio of the open semiconductor switches $S_1$, $S_2$. These namely act as voltage dividers of the voltage $U_{out}(t)$ applied to the output 8. For the profile of the voltage $U_{in}(t)$, it should also be considered that the voltage $U_{out}(t)$ applied to the output 8 can be discharged to a greater or lesser extent depending on a current possibly flowing through the DC load 3. In any case, the voltage $U_{in}(t)$ applied to the input differs significantly from the open circuit voltage $U_0$ of the DC source 2. FIG. 3 illustrates by way of example a value of the voltage $U_{in}(t)$ of nearly 0 V in the second inactive time window 32. In the subsequent third active time window 31, a power flow P through the switching circuit 10 is in principle possible, but it is now prevented by the microgap, which is why the values of voltage $U_{in}(t)$ and current $I_{in}(t)$ in FIG. 3 are shown as negligibly low.

The control circuit 5 now compares the values of current $I_{in}(t)$ and/or voltage $U_{in}(t)$ of the active time windows 31 detected by the measuring device 4 with the values of the respectively preceding active time window 31. When comparing the values between the second 31 and the third active time window 31, in FIG. 3, the control circuit 5 determines a difference between these values that exceeds a threshold value and signals an arc 9 in response thereto. In response to the signaling of the arc 9, the switching circuit 10 remains in the second operating mode BM2 until manual acknowledgement by a qualified person, with a power flow P between the DC source 2 and the output 8 being suppressed.

Figure 4:
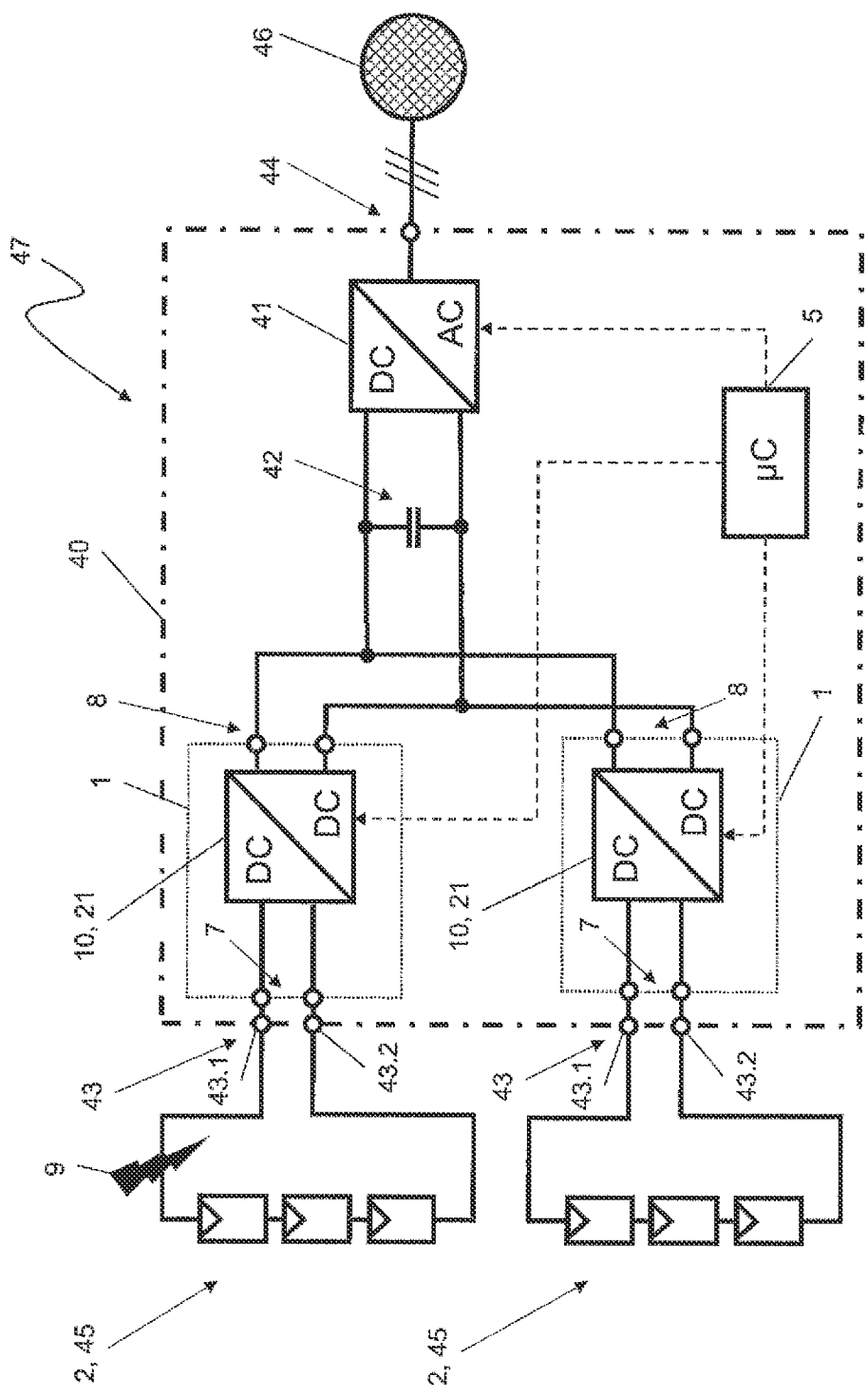
FIG. 4 shows a PV system comprising a PV inverter according to one embodiment of the disclosure.

FIG. 4 shows a photovoltaic (PV) system 47 comprising a PV inverter 40 according to one embodiment of the disclosure. The PV inverter 40 is configured as what is known as a multi-string inverter comprising several (in this case as an example: two) DC-side inputs 43 comprising input terminals 43.1 and 43.2 for connecting a PV string 45 as a DC source 2. Each of the inputs 43 is connected in parallel with a link circuit capacitance of a common DC link circuit 42 via a respective DC-DC converter 21, in this case a step-up converter. The link circuit capacitance is connected to an input of a DC-AC converter 41. The output of the DC-AC converter 41 is connected to an AC voltage (AC) grid 46 via an output 44 of the PV inverter 40 via corresponding AC isolating elements (not shown in FIG. 4).

The PV inverter 40 comprises a circuit arrangement 1 for each of the DC-side inputs 43. The circuit arrangements 1, in particular the switching circuits 10 thereof, are in this case each configured as DC-DC converters and are at least partially formed by the DC-DC converters 21 of the PV inverter 40 that are present anyway. The inputs 7 of the circuit arrangements 1 correspond here to the inputs 43 of the PV inverter 40. The outputs 8 of the circuit arrangements 1 each correspond here to the outputs of the DC-DC converter 21. The circuit arrangements 1 comprise a common control circuit 5 that is part of a central control circuit of the PV inverter 40 and is configured to control the DC-DC converter 21 and the DC-AC converter 41. The measuring devices 4 of the circuit arrangements are also part of the DC-DC converter 21 and are not explicitly illustrated in FIG. 4.

The method according to the disclosure is carried out via the control circuit 5 simultaneously for each DC source 2 configured as a PV string 45. Each of the PV strings 45 therefore has a discontinuous power flow P within its respective DC lines between the PV modules and the corresponding DC-side input 43 of the PV inverter 40 during normal operation of the PV inverter 40. In this case, active time windows 31 with a first period $\Delta t_1$ alternate with inactive time windows 32 with a second period $\Delta t_2$. The discontinuous power flow P within the two PV strings 45 can advantageously take place here in one embodiment in such a way that there is as little overlap as possible between the inactive time windows 32 of one PV string 45 and the inactive time windows of the other PV string 45, that is to say the inactive time windows are offset from each other as far as possible. If an arc 9, for example, a series arc, is now determined within one of the PV strings 45 by means of the control circuit 5, only that switching circuit 10, that is to say that DC-DC converter 21, which is assigned to that PV string 45 in which the series arc 9 was also detected is set to the second operating mode BM2 for a longer period—and possibly until a manual acknowledgement by a qualified person. In contrast, the respective other PV string 45 can continue to be operated with a discontinuous power flow P in the direction of its associated DC-side input 43.

What is claimed is:

1. A method for detecting an arc in a direct-current (DC) circuit comprising a DC load, a DC source supplying the DC load, and a circuit arrangement arranged between the DC source and the DC load, wherein the circuit arrangement comprises an input comprising two input terminals configured to connect to the DC source, an output comprising two output terminals configured to connect to the DC load, and a switching circuit arranged between the input and the output, wherein the switching circuit or the switching circuit in connection with an output voltage $U_{out}$ applied to the output of the circuit arrangement is configured to enable a power flow P between the DC source and the output in a first operating mode BM1 and is configured to suppress the power flow between the DC source and the output in a second operating mode BM2, comprising:
  cyclically interrupting the power flow P between the input and the output using the switching circuit such that the power flow P is enabled in an active time window with a first period $\Delta t_1$ in the first operating mode BM1 and the power flow P is suppressed in an inactive time window with a second period $\Delta t_2$ in the second operating mode BM2,
  detecting a current I characterizing the power flow P and/or a voltage U characterizing the power flow P in two consecutive active time windows comprising a current active time window and a preceding active time window,
  comparing the detected current I and/or voltage U of the current active time window with the detected current and/or voltage from the preceding active time window, and
  signaling an arc if the detected current I and/or voltage U of the current active time window differ from current and/or voltage of the preceding active time window by more than a threshold value,
  wherein a duration of the second period $\Delta t_2$ of the inactive time window is sufficient to quench an arc that may be present in the DC circuit and to suppress reignition of the arc quenched in the inactive time window in the active time window that immediately chronologically follows the inactive time window.

2. The method as claimed in claim 1, further comprising interrupting the power flow P between the input and the output either permanently, or for a period of several minutes, or until a manual acknowledgement.

3. The method as claimed in claim 1, wherein the current active time window and the preceding active time window are separated from one another by exactly one inactive time window.

4. The method as claimed in claim 1, wherein the second period $\Delta t_2$ comprises a duration between 0.1 ms and 10.0 ms.

5. The method as claimed in claim 1, wherein a duration of the second period $\Delta t_2$ is selected depending on the detected current I and/or voltage U of an immediately preceding active time window, and wherein the second period $\Delta t_2$ increases as the detected current I and/or the voltage U increases.

6. The method as claimed in claim 1, wherein the circuit arrangement comprises an input capacitance connected in parallel with the input, and further comprising detecting, in the inactive time window, an input current $I_{in}$ flowing at the input and/or an input voltage $U_{in}$ applied to the input between the input terminals, and determining the second period $\Delta t_2$ of the inactive time window depending on the detected input current $I_{in}$ and/or on the detected input voltage $U_{in}$.

7. The method as claimed in claim 6, wherein the second period $\Delta t_2$ of the inactive time window is further determined, wherein an end point of the inactive time window is dictated by a time when the detected input current $I_{in}$ falls below a further current threshold value $I_{TH2}$.

8. The method as claimed in claim 1, wherein the circuit arrangement comprises an input capacitance connected in parallel with the input, and further comprising measuring, in the inactive time window, an input current $I_{in}$ flowing at the input by evaluating a change over time in an input voltage $U_{in}$ applied to the input capacitance.

9. The method as claimed in claim 1, wherein the switching circuit comprises a DC-DC converter, and the circuit arrangement comprises an output capacitance connected in parallel with the output, and further comprising increasing, in the active time window, a voltage $U_{out}$ applied to the output capacitance toward an end of the first period $\Delta t_1$ by the switching circuit.

10. The method as claimed in claim 1, wherein a duration of the first period $\Delta t_1$ of the active time window is selected so that an arc energy that would be generated by a power loss of an assumed arc in the active time window does not exceed a predetermined maximum permitted energy value $E_{max}$.

11. The method as claimed in claim 1, wherein the DC source comprises a PV string and the DC load comprises a single-phase DC-AC converter connected on an output side thereof to an AC voltage (AC) grid, and wherein the cyclical interruption of the power flow P takes place so that there is a zero crossing of an AC current $I_{AC}(t)$ flowing via an output of the single-phase DC-AC converter during the second period $\Delta t_2$ of the inactive time window.

12. The method as claimed in claim 1, wherein a plurality of DC sources are each connected to the DC load in parallel with one another via a respective switching circuit to jointly supply the DC load with their respective power flows P, wherein the method is carried out concurrently for each of the DC sources so that a temporal overlap of the inactive time windows of the plurality of DC sources is minimized.

13. A circuit arrangement for detecting an arc in a DC circuit, comprising:
  an input comprising two input terminals configured to connect to a DC source, and an output comprising two output terminals configured to connect to a DC load,
  a switching circuit arranged between the input and the output, wherein the switching circuit or the switching circuit in connection with an output voltage $U_{out}$ applied to the output of the circuit arrangement is configured to enable a power flow P between the input and the output in a first operating mode (BM1) and to suppress a power flow P between the input and the output in a second operating mode (BM2),
  a measuring device configured to determine a voltage U applied to the input or to the output and/or a current I flowing in a connection line from one of the input terminals to one of the output terminals, and
  a control circuit configured to control the switching circuit, or control the switching circuit and the measuring device,
  wherein the control circuit is configured, in connection with the switching circuit and the measuring device, to:
  cyclically interrupt the power flow P between the input and the output using the switching circuit such that the power flow P is enabled in an active time window with a first period $\Delta t_1$ in the first operating mode BM1 and the power flow P is suppressed in an inactive time window with a second period $\Delta t_2$ in the second operating mode BM2,
  detect a current I characterizing the power flow P and/or a voltage U characterizing the power flow P in two consecutive active time windows comprising a current active time window and a preceding active time window,
  compare the detected current I and/or voltage U of the current active time window with the detected current and/or voltage from the preceding active time window, and signal an arc if the detected current I and/or voltage U of the current active time window differ from the detected current and/or voltage of the preceding active time window by more than a threshold value, wherein a duration of the second period $\Delta t_2$ of the inactive time window is sufficient to quench an arc that may be present in the DC circuit and to suppress reignition of the arc quenched in the inactive time window in the active time window that immediately chronologically follows the inactive time window.

14. The circuit arrangement as claimed in claim 13, wherein the switching circuit comprises a semiconductor switch arranged in one of the connection lines, wherein the semiconductor switch is free of a freewheeling diode, or wherein the semiconductor switch has an intrinsic freewheeling diode associated therewith.

15. The circuit arrangement as claimed in claim 13, wherein the circuit arrangement or the switching circuit of the circuit arrangement comprises a DC-DC converter.

16. A photovoltaic (PV) inverter comprising:
an input comprising two input terminals configured to connect to a PV string as a DC source and an output for connection to an AC voltage (AC) grid,
a DC-AC converter configured to convert a DC voltage to an AC voltage, and
a circuit arrangement comprising an input connected to the input of the PV inverter and comprising an output connected to an input of the DC-AC converter, wherein the circuit arrangement comprises:
the input comprising two input terminals configured to connect to the DC source, and the output comprising two output terminals configured to connect to a DC load comprising the DC-AC converter,
a switching circuit arranged between the input and the output, wherein the switching circuit or the switching circuit in connection with an output voltage $U_{out}$ applied to the output of the circuit arrangement is configured to enable a power flow P between the input and the output in a first operating mode (BM1) and to suppress a power flow P between the input and the output in a second operating mode (BM2),
a measuring device configured to determine a voltage U applied to the input or to the output and/or a current I flowing in a connection line from one of the input terminals to one of the output terminals, and
a control circuit configured to control the switching circuit, or control the switching circuit and the measuring device,
wherein the control circuit is configured, in connection with the switching circuit and the measuring device, to:
cyclically interrupt the power flow P between the input and the output using the switching circuit such that the power flow P is enabled in an active time window with a first period $\Delta t_1$ in the first operating mode BM1 and the power flow P is suppressed in an inactive time window with a second period $\Delta t_2$ in the second operating mode BM2,
detect a current I characterizing the power flow P and/or a voltage U characterizing the power flow P in two consecutive active time windows comprising a current active time window and a preceding active time window,
compare the detected values of current I and/or voltage U of the current active time window with the detected values of current and/or voltage from the preceding active time window, and signal an arc if the values of current I and/or voltage U of the current active time window differ from the current and/or voltage of the preceding active time window by more than a threshold value, wherein a duration of the second period $\Delta t_2$ of the inactive time window is sufficient to quench an arc that may be present in DC-circuit and to suppress reignition of the arc quenched in the inactive time window in the active time window that immediately chronologically follows the inactive time window.

17. The PV inverter as claimed in claim 16, comprising a plurality of inputs configured to connect to a respective PV string as a DC source, wherein the inputs are each connected to a common DC link circuit in parallel with one another via a respective DC-DC converter, and wherein the DC link circuit is connected to an input of the DC-AC converter, and comprising a plurality of circuit arrangements, wherein each of the inputs of the PV inverter is connected to the respective input of a circuit arrangement assigned thereto, and wherein the output of each of the circuit arrangements is connected to the respective input of the DC-AC converter, wherein each of the circuit arrangements comprise:
an input comprising two input terminals configured to connect to a respective PV string as a DC source, and an output comprising two output terminals configured to connect to the DC load comprising the DC-AC converter,
a switching circuit arranged between the input and the output, wherein the switching circuit or the switching circuit in connection with an output voltage $U_{out}$ applied to the output of the circuit arrangement is configured to enable a power flow P between the input and the output in a first operating mode (BM1) and to suppress a power flow P between the input and the output in a second operating mode (BM2),
a measuring device configured to determine a voltage U applied to the input or to the output and/or a current I flowing in a connection line from one of the input terminals to one of the output terminals, and
a control circuit configured to control the switching circuit, or control the switching circuit and the measuring device,
wherein the control circuit is configured, in connection with the switching circuit and the measuring device, to carry out a method comprising:
cyclically interrupting the power flow P between the input and the output using the switching circuit such that the power flow P is enabled in an active time window with the first period $\Delta t_2$ in the first operating mode BM1 and the power flow P is suppressed in an inactive time window with the second period $\Delta t_2$ in the second operating mode BM2,
detecting a current I characterizing the power flow P and/or a voltage U characterizing the power flow P in two consecutive active time windows comprising a current active time window and a preceding active time window,
comparing the detected current I and/or voltage U of the current active time window with the corresponding detected values of current and/or voltage from the preceding active time window, and
signaling an arc if the detected current I and/or voltage U of the current active time window differ from the detected current and/or voltage of the preceding active time window by more than a threshold value.

18. The PV inverter as claimed in claim 17, wherein a control circuit of the PV inverter is configured to control the DC-AC converter and the DC-DC converter of the PV inverter so that, during operation of the PV inverter, a voltage applied to the DC link circuit is kept above a maximum value of open circuit voltages of the individual PV strings.

* * * * *